US012593662B2

(12) United States Patent
Kim et al.

(10) Patent No.: US 12,593,662 B2
(45) Date of Patent: Mar. 31, 2026

(54) ELECTRONIC DEVICE FOR DETECTING DEFECT IN SEMICONDUCTOR PACKAGE AND OPERATING METHOD THEREOF

(71) Applicant: SAMSUNG ELECTRONICS CO., LTD., Suwon-si (KR)

(72) Inventors: Hyeon Joon Kim, Suwon-si (KR); Dongsoo Lee, Suwon-si (KR); Sunghyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 18/472,364

(22) Filed: Sep. 22, 2023

(65) Prior Publication Data

US 2024/0274480 A1 Aug. 15, 2024

(30) Foreign Application Priority Data

Feb. 15, 2023 (KR) ........................ 10-2023-0020374

(51) Int. Cl.
H01L 21/66 (2006.01)

(52) U.S. Cl.
CPC .............. H01L 22/34 (2013.01); H01L 22/12 (2013.01); H01L 22/22 (2013.01)

(58) Field of Classification Search
None
See application file for complete search history.

(56) References Cited

U.S. PATENT DOCUMENTS

| | | | |
|---|---|---|---|
| 6,521,889 B1 | 2/2003 | Ina et al. | |
| 7,112,960 B2 | 9/2006 | Miller et al. | |
| 7,135,852 B2 | 11/2006 | Renken et al. | |
| 7,306,695 B2 | 12/2007 | Kasai | |
| 7,612,895 B2 | 11/2009 | Gabriel et al. | |
| 9,229,058 B2 | 1/2016 | Ohmart et al. | |
| 9,378,993 B2 | 6/2016 | Hosaka | |
| 10,096,508 B2 | 10/2018 | Paramio et al. | |

FOREIGN PATENT DOCUMENTS

| | | |
|---|---|---|
| EP | 0291329 | 1/1994 |
| JP | 5317753 | 10/2013 |
| KR | 10-2458131 | 10/2022 |

*Primary Examiner* — Anthony Ho
(74) *Attorney, Agent, or Firm* — Morgan, Lewis & Bockius LLP

(57) ABSTRACT

A method of operating an electronic device for detecting a defect due to a particle in an equipment generated during a bonding process of a semiconductor chip is disclosed. For example, the method may include obtaining, by the electronic device, profile data including operation information of the equipment from the equipment during the bonding process. Additionally, the method may include calculating, by the electronic device, characteristic data of bonded chips (e.g., from the bonding process) by pre-processing the profile data. Subsequently, after the bonding process is completed, the method may include selecting, by the electronic device, a coordinate of a defective chip on a substrate as a defect coordinate by comparing result data of a reference chip and peripheral chips based on the characteristic data. In some embodiments, the result data may include respective height value information of the bonded chips.

20 Claims, 10 Drawing Sheets

| RV1 | RV2 | Accuracy |
|-----|-----|----------|
| 5um | 5um | 94% |
| 5um | 3.5um | 80% |

ELECTRONIC DEVICE FOR DETECTING DEFECT IN SEMICONDUCTOR PACKAGE AND OPERATING METHOD THEREOF

CROSS-REFERENCE TO RELATED APPLICATIONS

This application claims priority under 35 U.S.C. § 119 to Korean Patent Application No. 10-2023-0020374, filed on Feb. 15, 2023, in the Korean Intellectual Property Office, the disclosures of which are incorporated by reference herein in their entireties.

BACKGROUND

Embodiments of the present disclosure described herein generally relate to semiconductor devices and, more particularly, to an electronic device for detecting a defect due to particles generated during a bonding process of a semiconductor chip and an operating method thereof.

A semiconductor may include, or refer to, a material with conductivity between a conductor and an insulator. Semiconductor materials are used in semiconductor devices and are used to create integrated circuits in an electronic device. Semiconductors may be used in televisions, computers, tablets, and mobile phones to name a few applications. For instance, semiconductor packages may include integrated circuit chips implemented in a form suitable for use in electronic products. Generally, in semiconductor packages, a semiconductor chip may be mounted on a wafer or a printed circuit board (PCB) (e.g., and the semiconductor chip may be electrically connected to the wafer or the PCB using bonding wires or bumps).

The mass production of semiconductor devices has resulted in refinements in the manufacturing process in order to meet business requirements and consumer demand requirements. In some cases, during a bonding process with respect to the semiconductor chip (e.g., a process when there are particles adhered to an equipment), a defect may occur on the wafer or the PCB after which the bonding process is completed. When a defect occurs due to particles in the equipment, manufacturing may be disrupted (e.g., it may take a long time to analyze the cause of the defect, resulting in a low product yield). Accordingly, there is a need in the art for improved (or alternative) semiconductor manufacturing/packaging processes.

SUMMARY

Embodiments of the present disclosure provide an electronic device for detecting a defect in a semiconductor package and an operating method thereof.

According to an embodiment of the present disclosure, a method of operating an electronic device may include: obtaining, by the electronic device, profile data including operation information of an equipment during a bonding process, wherein the bonding process comprises forming a semiconductor chip based on bonding a plurality of chips on a substrate; calculating, by the electronic device, characteristic data of bonded chips by pre-processing the profile data; and after the bonding process (e.g., after the bonding process is completed), selecting, by the electronic device, a defective chip of the plurality of chips by comparing result data of a reference chip and peripheral chips based on the characteristic data. In some embodiments, each of the result data may include height value information of the bonded chips.

According to an embodiment of the present disclosure, an electronic device includes: a first device connected to an equipment, where the first device includes a data collector that acquires profile data including operation information of the equipment from the equipment performing a bonding process of a semiconductor chip; a second device that includes a pre-processor and a defect detector, where the pre-processor pre-processes the profile data to calculate characteristic data of bonded chips and the defect detector selects a defect coordinate of a defective chip on a substrate as a defective coordinate by comparing result data of a reference chip and peripheral chips based on the characteristic data after the bonding process is completed; and a main server that stores data generated during the bonding process. In some embodiments, the result data may include respective height value information of the bonded chips.

According to an embodiment of the present disclosure, a server includes a memory that stores instructions and a processor that accesses the memory to execute the instructions loaded into the memory. The instructions, when executed by the processor, may cause the processor to: obtain profile data including operation information of an equipment preforming a bonding process of a chip from an outside device; to calculate characteristic data of bonded chips by pre-processing the profile data; and after the bonding process is completed, to select a coordinate of a defective chip on a substrate as a defect coordinate by comparing result data of a reference chip and peripheral chips based on the characteristic data. In some embodiments, the result data may include respective height value information of the bonded chips.

BRIEF DESCRIPTION OF THE FIGURES

A detailed description of each drawing is provided to facilitate a more thorough understanding of the drawings referenced in the detailed description of the present disclosure. Embodiments of the present disclosure will be more clearly understood from the following detailed description taken in conjunction with the accompanying drawings in which.

DETAILED DESCRIPTION

Figure 1:
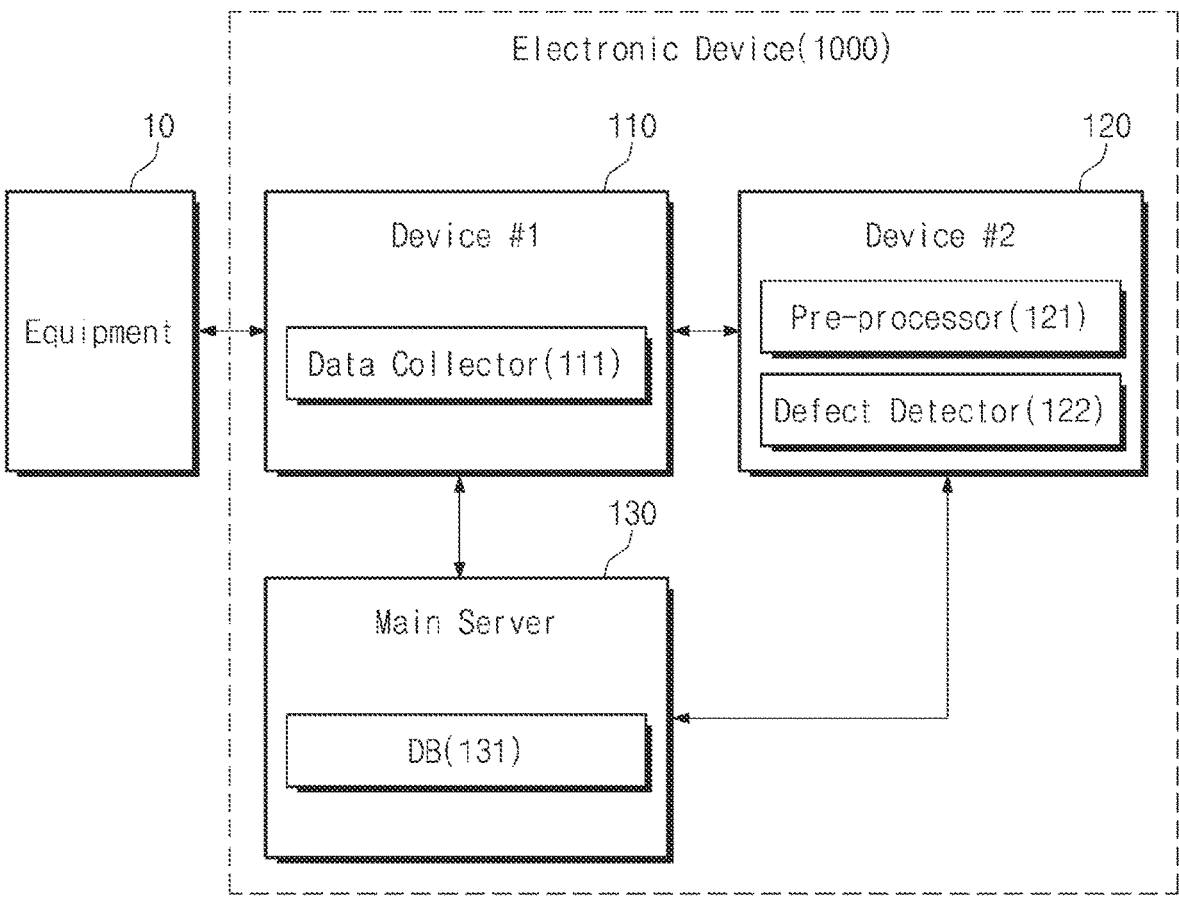
FIG. 1 is a block diagram illustrating an electronic device according to an embodiment of the present disclosure.

Semiconductor chips (e.g., integrated circuits (ICs), microchips, memory modules, microprocessors, etc.) may include electric circuits with many components (e.g., transistors, wiring, etc.) formed on a wafer (e.g., semiconductor wafer). The semiconductor chips may be essential components of electronic devices, enabling advances in communications, computing, healthcare, military systems, transportation, clean energy, and countless other applications. Additionally, semiconductor packages may include individual semiconductor chips (e.g., integrated circuit chips) that are implemented in a form suitable for use in electronic products. For example, in semiconductor packages, one or more semiconductor chips are mounted on a wafer or a printed circuit board (PCB) and are electrically connected to the wafer or the PCB (e.g., using bonding wires or bumps).

In some cases, the one or more semiconductor chips that form the semiconductor package may be joined together through a bonding process. For example, an equipment (e.g., chip bonding machine, die bonder, flip chip bonder, flip chip die bonder, wire bonding machine, etc.) may perform the bonding process, where the equipment is capable of bonding the one or more semiconductor chips (e.g., "chips") on the wafer or PCB (e.g., a "substrate" or a "semiconductor substrate") during a semiconductor packaging process. In some examples, the equipment may at least include a component (e.g., a header) that enables or supports the bonding process.

However, in some cases, when manufacturing a semiconductor package and/or bonding semiconductor chips together, defects may occur or may be formed. For example, the defects may be formed based on particles in the equipment generated during the chip bonding process. The defects may affect an integrity of how the semiconductor chips are bonded together and/or how the semiconductor chips are mounted or bonded to the wafer or PCB. Additionally, when a defect occurs due to particles smaller in size (e.g., 5-10 micrometers or microns ($\mu$m)), detecting the defect may be difficult. For example, it may take a long time to perform mass analysis after an electrical die sorting (EDS) test process to identify or detect the defect.

Accordingly, as described herein, techniques are provided for detecting a defect due to particles generated in a bonding operation of a semiconductor chip on a substrate during a semiconductor packaging process. For example, an electronic device and an operating method thereof may be provided for detecting a defect due to particles at the time when a bonding process on a substrate is completed by utilizing profile data including operation information of the equipment used for performing the bonding process.

Hereinafter, embodiments of the present disclosure may be described in detail and clearly to such an extent that an ordinary one in the art easily implements the present disclosure.

Components described in the specification and function blocks illustrated in drawings may be implemented with software, hardware, or a combination thereof. For example, the software may be a machine code, firmware, an embedded code, and application software. Additionally, the hardware may include, for example, an electrical circuit, an electronic circuit, a processor, a computer, an integrated circuit, integrated circuit cores, a pressure sensor, an inertial sensor, a microelectromechanical system (MEMS), a passive element, or a combination thereof.

FIG. 1 is a block diagram illustrating an electronic device 1000 according to an embodiment of the present disclosure as an example. Referring to FIG. 1, an electronic device 1000 may include a first device 110, a second device 120, and a main server 130. In some embodiments, the first device 110 and the second device 120 may be a computing system configured to process or store various information, such as personal computers (PCs), notebook computers, laptop computers, servers, application servers, workstations, tablet PCs, smart phones, digital cameras, black-box devices, etc.

The first device 110 may control the overall operation of an equipment 10. In some embodiments, the first device 110 may be a computer coupled to the equipment 10. For example, the equipment 10 may be an equipment for bonding a semiconductor chip (hereinafter, referred to as a chip) on a wafer or a PCB (hereinafter, referred to as a substrate) during a semiconductor packaging process. Additionally, the first device 110 may communicate with the equipment 10. For example, the first device 110 may communicate with the equipment 10 to obtain data from the equipment 10. Subsequently, in some embodiments, the first device 110 may process the obtained data. In some embodiments, the first device 110 may transmit the obtained data and the processed data to the second device 120. Additionally or alternatively, the first device 110 may transmit the obtained data and the processed data to the main server 130.

In some embodiments, the first device 110 may include a data collector 111. The data collector 111 may be implemented by hardware, software, or a combination of the hardware and the software.

In some embodiments, the data collector 111 may be implemented in software. At least some of the functions implemented in software may be stored as instructions in a non-transitory computer-readable medium (not illustrated). A processor of the first device 110 may cause the first device 110 to perform functions corresponding to the instructions by executing instructions stored in the non-transitory computer-readable medium.

In some embodiments, the data collector 111 may obtain data from the equipment 10. For example, the data collector 111 may obtain profile data 'PRF_D' from the equipment 10 in real time, where the profile data 'PRF_D' may include operation information of a header of the equipment 10 during a chip bonding process.

Additionally, the data collector 111 may process the obtained data. For example, the data collector 111 may process the profile data 'PRF_D' obtained from the equipment 10 to link information on the substrate. In some embodiments, the information on the substrate may include information such as an identifier (ID) of a wafer or PCB, coordinates of a chip bonded to the substrate, and the like.

In some embodiments, the second device 120 may communicate with the first device 110 and may receive data from the first device 110. Additionally, the second device 120 may pre-process the received data. Subsequently, the second device 120 may transmit the pre-processed data to the main server 130.

In some embodiments, as described herein, the second device 120 may detect a defect due to particles in equipment generated during a chip bonding process based on the pre-processed data. Accordingly, the second device 120 may transmit data about the detected defect to the main server 130.

In some embodiments, the second device 120 may include a pre-processor 121 and a defect detector 122. The pre-processor 121 and defect detector 122 may be implemented by hardware, software, or a combination of the hardware and the software.

In some embodiments, the pre-processor 121 and the defect detector 122 may be implemented in software. At least some of the functions implemented in software may be stored as instructions in a non-transitory computer-readable medium (not illustrated). A processor of the second device 110 may cause the second device 110 to perform functions corresponding to the instructions by executing instructions stored in the non-transitory computer-readable medium.

The pre-processor 121 may pre-process the data received from the first device 110. For example, the pre-processor 121 may pre-process the data received from the first device 110 to calculate characteristic data 'CHAR_D' with respect to chips bonded on a substrate (e.g., individual characteristic data 'CHAR_D' for each of the chips bonded on the substrate). In some embodiments, the characteristic data 'CHAR_D' may include information corresponding to height values of the chips bonded on the substrate.

In some embodiments, the defect detector 122 may detect defects on the substrate based on the characteristic data 'CHAR_D' calculated by the pre-processor 121. For example, after the bonding process is completed, the defect detector 122 may select a coordinate of a defective chip on a substrate on which the bonding process is completed as a defect coordinate 'DF_COOR' by comparing result data 'RES_D' of a reference chip and peripheral chips based on the characteristic data 'CHAR_D.' In some embodiments, the reference chip may indicate an arbitrary chip selected from among bonded chips in order to determine a cluster in which defective chips are distributed in a specific area on the substrate. The result data 'RES_D' may include information corresponding to height values of chips bonded on the substrate (e.g., individual heights of the reference chip and the peripheral chips bonded on the substrate).

In some embodiments, the defect detector 122 may select at least one of the result data 'RES_D' of the bonded chips as representative data 'RPR_D' based on the characteristic data 'CHAR_D.' Additionally, in some embodiments, the defect detector 122 may correct deviations between the result data 'RES_D' of bonded chips based on the representative data 'RPR_D.'

For example, the defect detector 122 may divide the substrate on which the bonding process is completed into a first area and a second area, may select first representative data 'RPR_D_1' for the first area, and may select second representative data 'RPR_D_2' for the second area. Subsequently, the defect detector 122 may correct deviations between result data 'RES_D' of chips bonded to the first area based on the first representative data 'RPR_D_1' and may correct deviations between the result data 'RES_D' of chips bonded to the second area based on the second representative data 'RPR_D_2.'

In some embodiments, the defect detector 122 may compare the deviation-corrected result data 'RES_D' based on the characteristic data 'CHAR_D' to determine the coordinate of the defective chip on the substrate on which the bonding process is completed as the defect coordinate 'DF_COOR.'

In some embodiments, the main server 130 may communicate with the first device 110 and the second device 120. For example, the main server 130 may receive data from the first device 110 and the second device 120 and/or may provide data to the first device 110 and the second device 120.

The main server 130 may include a database 131. The database 131 may store data received from the first device 110 and the second device 120.

For example, the database 131 may store the profile data 'PRF_D' received from the first device 110. Additionally, the database 131 may store data processed by the data collector 111 when data is received into the first device 110.

For example, the database 131 may store data pre-processed by the pre-processor 121 when data is received into the second device 120. Additionally or alternatively, the database 131 may store data about defects detected by the defect detector 122 when data is received into the second device 120.

Figure 2:
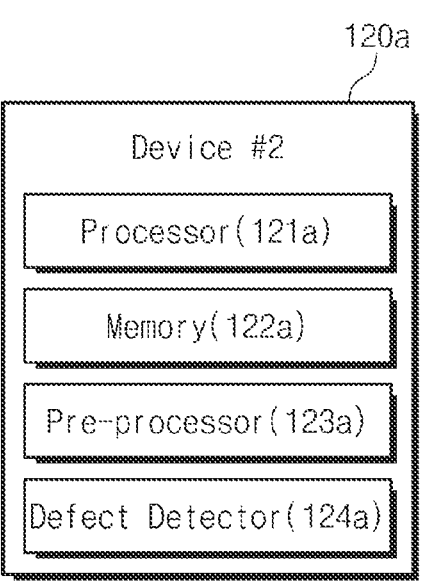
FIG. 2 is a block diagram illustrating a second device as described with reference to FIG. 1 in detail.

FIG. 2 is a block diagram illustrating the second device 120 as described with reference to FIG. 1 in detail. For example, FIG. 2 may include a second device 120a, which may represent an example of the second device 120 as described with reference to FIG. 1. Referring to FIGS. 1 and 2, the second device 120a may include a processor 121a, a memory 122a, a pre-processor 123a and a defect detector 124a.

The pre-processor 123a and the defect detector 124a may be the same as the pre-processor 121 and the defect detector 122, respectively, as described with reference to FIG. 1. Thus, additional description will be omitted to avoid redundancy.

In some embodiments, the second device 120a may be an application server. For example, the second device 120a may be implemented as a web server or a database management system (DBMS).

The processor 121a may control overall operations of the second device 120a. The processor 121a may access memory 122a and may execute instructions or data loaded into memory 122a. For example, the processor 121a may execute the instructions loaded into the memory 122a to operate the pre-processor 123a and the defect detector 124a.

In some embodiments, the memory 122a may load instructions stored in an external non-transitory computer-readable medium (not illustrated).

The memory 122a may be a double data rate synchronous dynamic random access memory (DDR SDRAM), a high bandwidth memory (HBM), a hybrid memory cube (HMC), a dual in-line memory module (DIMM), an Optane dual in-line memory module (DIMM), and/or a non-volatile DIMM (NVMDIMM).

Figure 3:
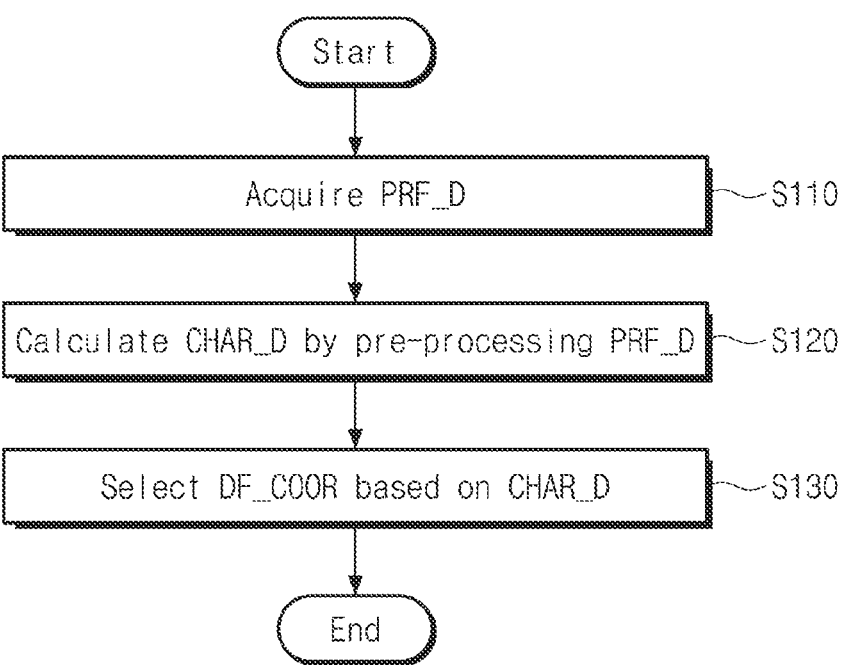
FIG. 3 is a flowchart illustrating a method of operating an electronic device according to an embodiment of the present disclosure.

FIG. 3 is a flowchart illustrating an operating method of the electronic device 1000 (e.g., as described with reference to FIG. 1) according to an embodiment of the present disclosure. In some examples, the flowchart illustrating an operating method of the electronic device 1000 as described with reference to FIG. 3 may implement aspects of or may be implemented by aspects as described with reference to FIGS. 1 and 2. For example, referring to FIGS. 1 and 3, in an operation S110, the data collector 111 of the first device 110 may acquire the profile data 'PRF_D' from the equipment 10 in real time, where the profile data 'PRF_D' includes operation information of a header of the equipment 10 during a chip bonding process.

In some embodiments, the data collector 111 may process the profile data 'PRF_D' acquired from the equipment 10 to link information about the substrate. For example, the information on the substrate may include information such as an ID of a wafer or a PCB, coordinates of a chip bonded on the substrate, and the like.

In an operation S120, the pre-processor 121 of the second device 120 may pre-process the data received from the first device 110 to calculate the characteristic data 'CHAR_D' of the chips bonded on the substrate. For example, the characteristic data 'CHAR_D' may include information for each of the chips bonded on the substrate and/or for a subset of the chips bonded on the substrate. In some embodiments, each of the characteristic data 'CHAR_D' may include information corresponding to height values of chips bonded on the substrate.

For example, each of the characteristic data 'CHAR_D' for the chips bonded on the substrate may include first information corresponding to a first height value 'HV1' of a chip at the moment when the header of the equipment 10 and the chip are first touched, second information corresponding to a second height value 'HV2' when the chip is pressed by the header of the equipment 10, and third information corresponding to a third height value 'HV3' of the chip maximally pressed by the header of the equipment 10. For example, second information may correspond to a second height value 'HV2' when the chip is pressed by the header of the equipment 10 to a first pressure value, and third information may correspond to a third height value 'HV3' when the chip is pressed by the header of the equipment 10 to a second pressure value (e.g., a second pressure value greater than the first pressure value, such as a maximum pressure that may be applied by the header of the equipment 10).

In an operation S130, the defect detector 122 of the second device 120 may detect defects on the substrate based on the characteristic data 'CHAR_D' calculated by the pre-processor 121. For example, after the bonding process is completed, the defect detector 122 may select a coordinate of a defective chip on a substrate on which the bonding process is completed as defect coordinate 'DF_COOR' by comparing result data 'RES_D' of a reference chip and peripheral chips based on the characteristic data 'CHAR_D.' In some embodiments, the reference chip may indicate an arbitrary chip selected from among bonded chips in order to determine a cluster in which defective chips are distributed in a specific area on the substrate.

In some embodiments, each of the result data 'RES_D' may include information corresponding to a height value of a chip bonded on the substrate. For example, each of the result data 'RES_D' may include the third information corresponding to the third height value 'HV3' of respective chips bonded on the substrate.

In some embodiments, the defect detector 122 may select at least one of the result data 'RES_D' of the bonded chips as the representative data 'RPR_D' based on the characteristic data 'CHAR_D.' Additionally, the defect detector 122 may correct deviations between result data 'RES_D' of bonded chips based on the representative data 'RPR_D.'

In some embodiments, the defect detector 122 may compare the deviation-corrected result data 'RES_D' based on the characteristic data 'CHAR_D' to determine the coordinate of the defective chip on the substrate on which the bonding process is completed as the defect coordinate 'DF_COOR.'

Figure 4:
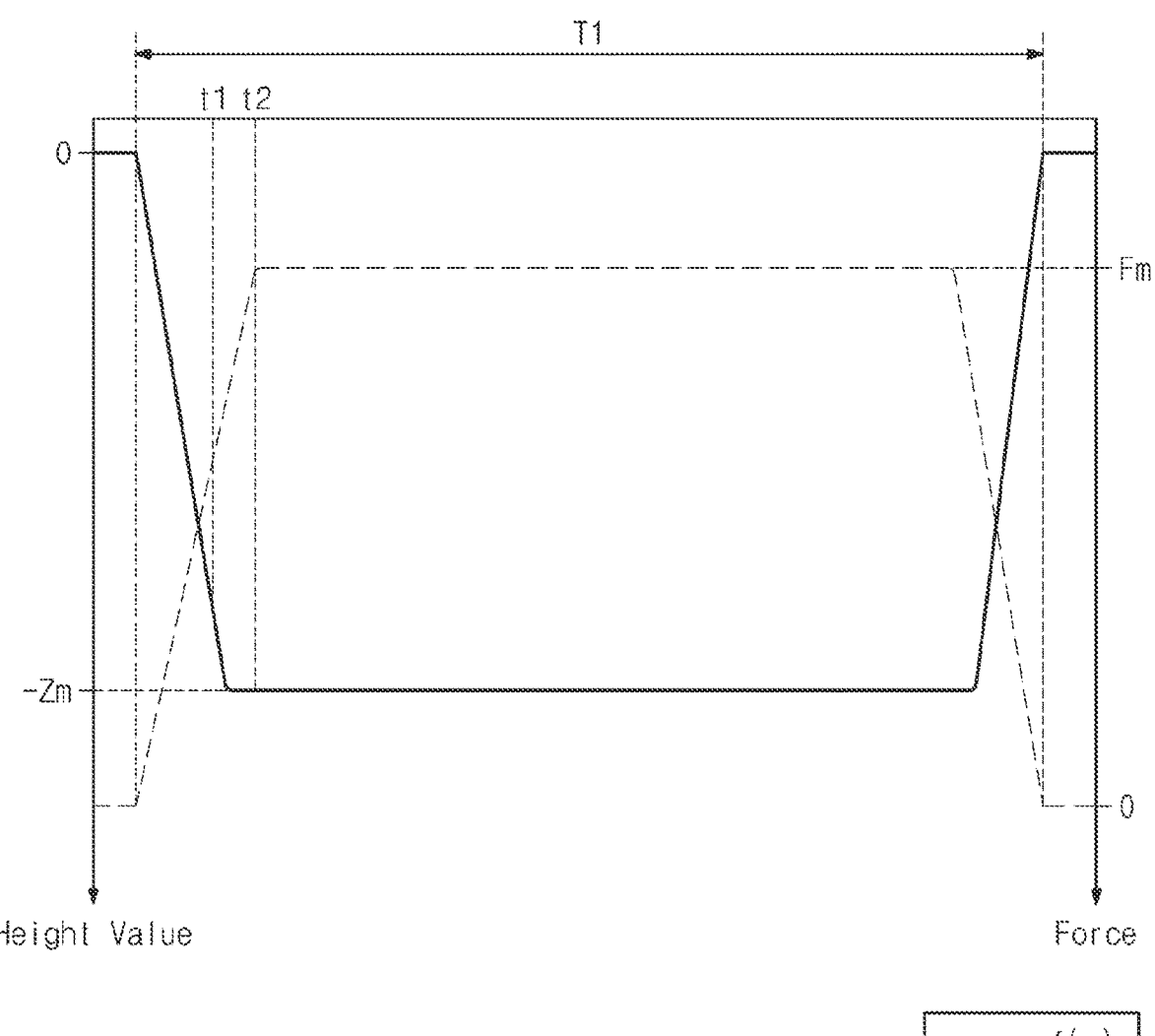
FIG. 4 is a conceptual diagram illustrating profile data according to an embodiment of the present disclosure.

FIG. 4 is a conceptual diagram illustrating profile data 'PRF_D' according to an embodiment of the present disclosure as an example. In some examples, the conceptual diagram illustrating the profile data 'PRF_D' as described with reference to FIG. 4 may implement aspects of or may be implemented by aspects as described with reference to FIGS. 1-3. In FIG. 4, a horizontal axis represents time, and a vertical axis represents height value or pressure. In FIG. 4, a function f(x) represents an amount of change in a height value in a direction perpendicular to the substrate of the header of the equipment 10, for example, in a Z direction, over time during a chip bonding process. Additionally, a function g(x) represents an amount of change in pressure applied to the chip by the header of the equipment 10 over time during the chip bonding process.

During operation of the equipment 10, the header of the equipment 10 moves along the Z direction, and it is assumed that the height value of the header of the equipment 10 before operation is "0." It is assumed that a first time 'T1' represents the time required for the equipment 10 to bond one chip on the substrate, a first time point 't1' represents a time point of the moment when the header of the equipment 10 first touches the chip, and a second time point 't2' represents a time point of the moment when the chip is maximally pressed by the header of the equipment 10.

Referring to FIGS. 1, 3, and 4, the data collector 111 may obtain the profile data 'PRF_D' including operation information of the header of the equipment 10 from the equipment 10 in real time while the bonding process of the chip is performed. For example, the data collector 111 may obtain the operation information of the header of the equipment 10 by obtaining the profile data 'PRF_D.'

In some embodiments, the data collector 111 may acquire the operation information along the Z direction of the header of the equipment 10 during the chip bonding process by obtaining the profile data 'PRF_D.' For example, the data collector 111 may obtain the operation information from "0" to "Zm" in the Z direction of the header of the equipment 10 during the first time 'T1' by obtaining the profile data 'PRF_D.'

Some embodiments of the present disclosure may be described, for illustrative purposes, using directional information (e.g., although, in certain aspects, other implementations may be possible by analogy, without departing from the scope of the present disclosure). For instance, in some cases, a X-direction and a Y-direction may be referred to as horizontal directions (e.g., where the X-direction and the Y-direction may define a horizontal plane) and a Z-direction may be referred to as a vertical direction (e.g., or a height direction). In some cases, a height or vertical direction may refer to a direction perpendicular to a surface of a substrate of the header of the equipment 10 (e.g., where a surface of the substrate of the header of the equipment 10 may be parallel to a horizontal plane).

Additionally, the data collector 111 may obtain information on the pressure applied to the chip by the header of the equipment 10 during the chip bonding process by obtaining the profile data 'PRF_D.' For example, the data collector 111 may obtain the pressure information from "0" to "Fm" applied to the chip by the header of the equipment 10 during the first time 'T1' by obtaining the profile data 'PRF_D.'

In some embodiments, the data collector 111 may obtain coordinate information on a substrate of a chip on which the equipment 10 performs a bonding process by obtaining the profile data 'PRF_D.'

Figure 5A:
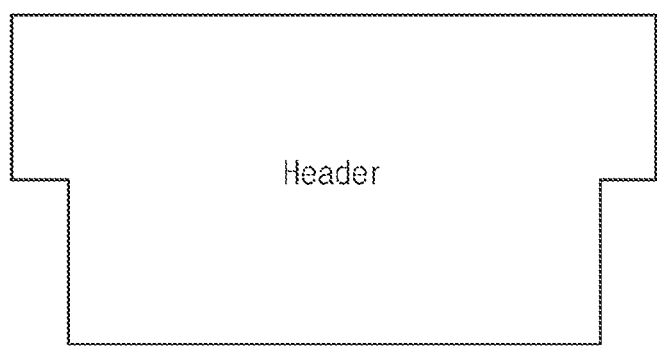
FIG. 5A and FIG. 5B are conceptual diagrams for describing characteristic data, according to an embodiment of the present disclosure.
Figure 5A:
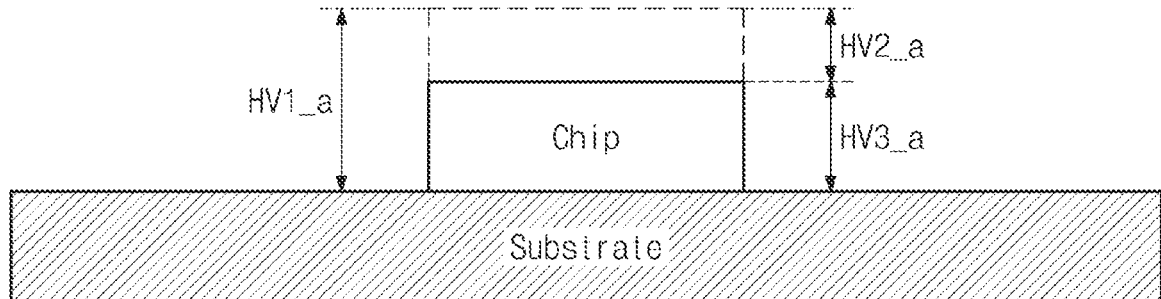
Figure 5B:
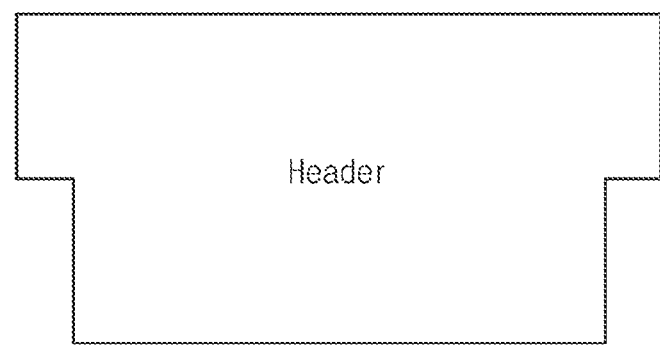
Figure 5B:
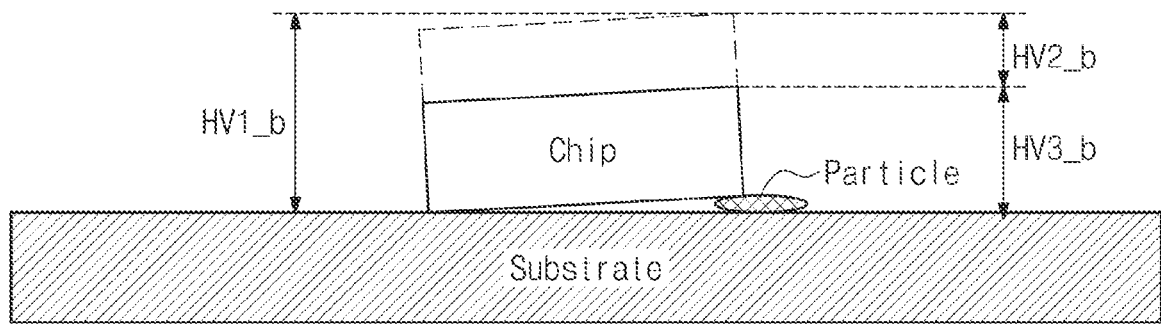

FIGS. 5A and 5B are conceptual diagrams for describing characteristic data 'CHAR_D' according to an embodiment of the present disclosure by way of example. In some examples, the conceptual diagrams for describing characteristic data 'CHAR_D' as described with reference to FIGS. 5A and 5B may implement aspects of or may be implemented by aspects as described with reference to FIGS. 1-4. FIG. 5A illustrates a conceptual diagram of the characteristic data 'CHAR_D' when there is no particle in the equipment, and FIG. 5B illustrates a conceptual diagram of the characteristic data 'CHAR_D' when there is a particle in the equipment.

Referring to FIGS. 1 and 3-5A, each of the characteristic data 'CHAR_D' calculated by the pre-processor 121 may include height value information about a respective chip bonded on the substrate.

For example, each of the characteristic data 'CHAR_D' may include first information corresponding to a first height value 'HV1_a' of the chip at the moment when the header of the equipment 10 and the chip are first touched. In this case, the first height value 'HV1_a' may represent the height value of the chip at the first time point 't1' as described with reference to FIG. 4.

Additionally or alternatively, each of the characteristic data 'CHAR_D' may include second information corresponding to a second height value 'HV2_a' when the chip is being pressed by the header of the equipment 10. In this case, the second height value 'HV2_a' may represent a height value of the chip at any time point from the first time point 't1' to the second time point 't2' as described with reference to FIG. 4.

Additionally or alternatively, each of the characteristic data 'CHAR_D' may include third information corresponding to a third height value 'HV3_a' of a chip that is maximally pressed by the header of the equipment 10. In this case, the third height value 'HV3_a' may represent the height value of the chip at the second time point 't2' as described with reference to FIG. 4.

In some embodiments, the first information corresponding to the first height value 'HV1_a' may be calculated from the slope of the function f(x) as described with reference to FIG. 4. For example, the first height value 'HV1_a' may represent the height value of the chip at the time when the value of the function f'(x) becomes maximum.

In some embodiments, the second information corresponding to the second height value 'HV2_a' may be calculated from first information corresponding to the first height value 'HV1_a' and third information corresponding to the third height value 'HV3_a.' For example, the second height value 'HV2_a' may represent a height value corresponding to a difference between the first height value 'HV1_a' and the third height value 'HV3_a.'

In some embodiments, the third information corresponding to the third height value 'HV3_a' may be calculated from the slope of the function g(x) as described with reference to FIG. 4. For example, the third height value 'HV3_a' may represent the height value of the chip at the time when the value of the function g'(x) becomes maximum.

Referring to FIGS. 1 and 3-5B, a first height value 'HV1_b,' a second height value 'HV2_b,' and a third height value 'HV3_b' as described and illustrated in the example of FIG. 5B may be respectively different from the first height 'HV1_a,' the second height 'HV2_a,' and the third height value 'HV3_a' as described with reference to FIG. 5A based on particles present on the substrate.

For example, based on the particles present on the substrate, the first height value 'HV1_b' as described with reference to FIG. 5B may be different from the first height value 'HV1_a' as described with reference to FIG. 5A, the second height value 'HV2_b' as described with reference to FIG. 5B may be different from the second height value 'HV2_a' as described with reference to FIG. 5A, and the third height value 'HV3_b' as described with reference to FIG. 5B may be different from the third height value 'HV3_a' as described with reference to FIG. 5A.

As described above, the characteristic data 'CHAR_D' may include first information corresponding to the first height value 'HV1' of respective chips at the moment when the header of the equipment 10 and the chips are first touched, second information corresponding to the second height value 'HV2' as much as the respective chips are pressed by the header of the equipment 10, and third information corresponding to the third height value 'HV3' of the respective chips maximally pressed by the header of the equipment 10.

Figure 6:
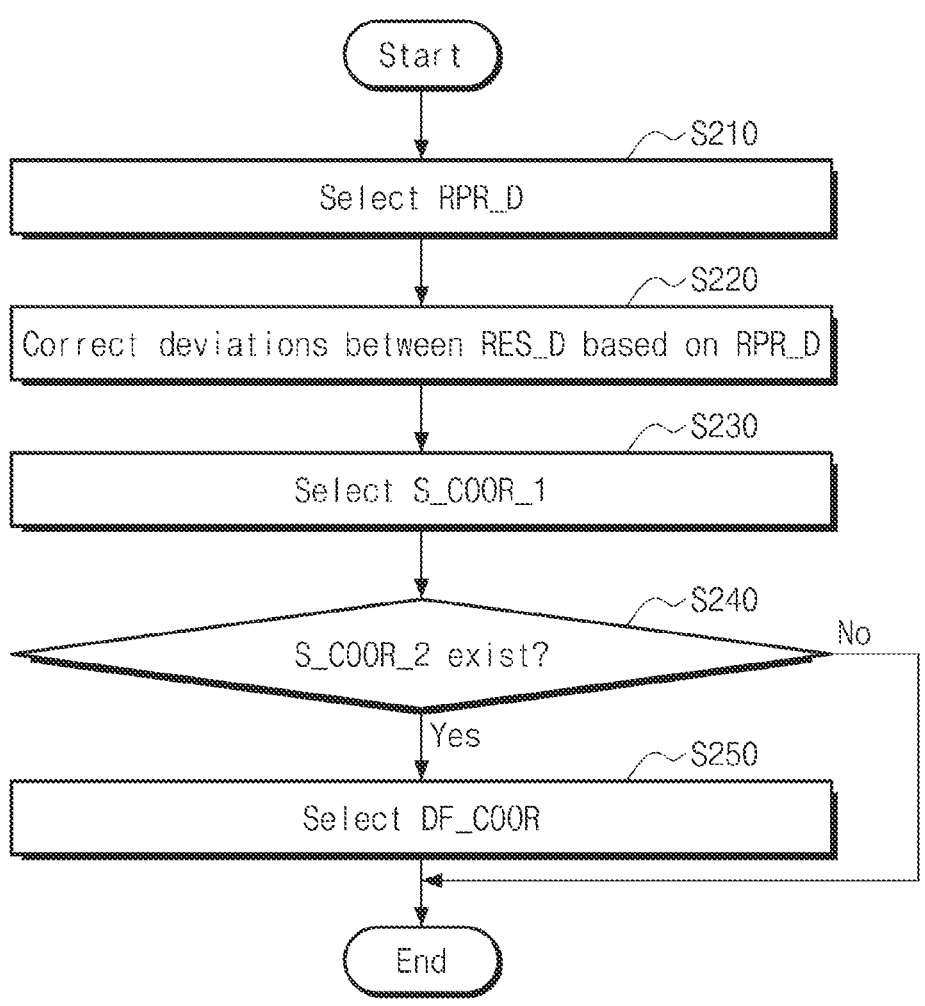
FIG. 6 is a flowchart illustrating operation S130 as described with reference to FIG. 3 in detail.

FIG. 6 is a flowchart illustrating operation S130 as described with reference to FIG. 3 in detail. Referring to FIGS. 1, 3, and 6, in an operation S210, the defect detector 122 may select at least one of the result data 'RES_D' of the bonded chips as the representative data 'RPR_D' based on the characteristic data 'CHAR_D.'

For example, the defect detector 122 may select at least one of the result data 'RES_D' of the bonded chips as the representative data 'RPR_D' based on the third information corresponding to the third height value 'HV3.' In some embodiments, the representative data 'RPR_D' may include result data 'RES_D' of a chip having the lowest third height value 'HV3.'

In some embodiments, the defect detector 122 may divide the substrate on which the bonding process is completed into a first area and a second area. Additionally, the defect detector 122 may select first representative data 'RPR_D_1' for the first area and second representative data 'RPR_D_2' for the second area based on third information corresponding to the third height value 'HV3.'

In an operation S220, the defect detector 122 may correct deviations between result data 'RES_D' of the bonded chips based on the representative data 'RPR_D.' For example, the defect detector 122 may correct deviations between the result data 'RES_D' of the bonded chips by performing a subtraction operation on the result data 'RES_D' of the bonded chips with the representative data 'RPR_D.'

In some embodiments, the defect detector 122 may correct deviations between the result data 'RES_D' of chips bonded in the first area based on the first representative data 'RPR_D_1' and may correct deviations between the result data 'RES_D' of chips bonded in the second area based on the second representative data 'RPR_D_2.'

In an operation S230, the defect detector 122 may select a coordinate of a reference chip as a first suspected coordinate 'S_COOR_1' where a defect may occur.

Figure 8A:
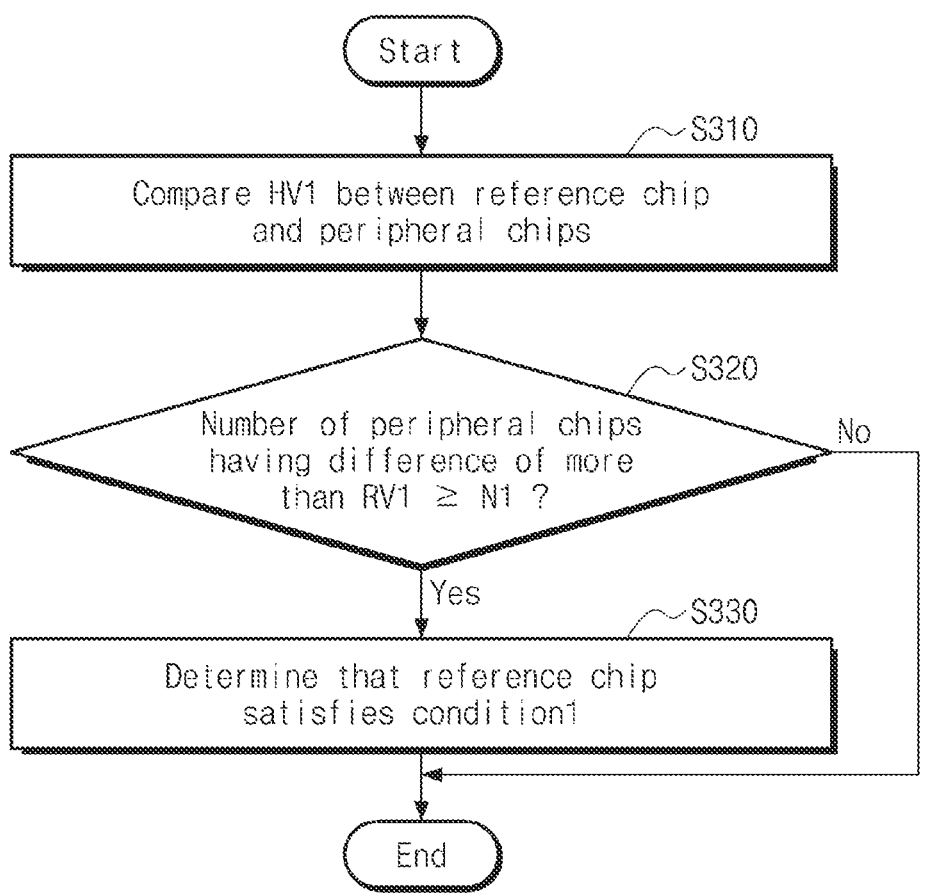
FIG. 8A and FIG. 8B are flowcharts illustrating operation S230 as described with reference to FIG. 6 in detail.
Figure 8B:
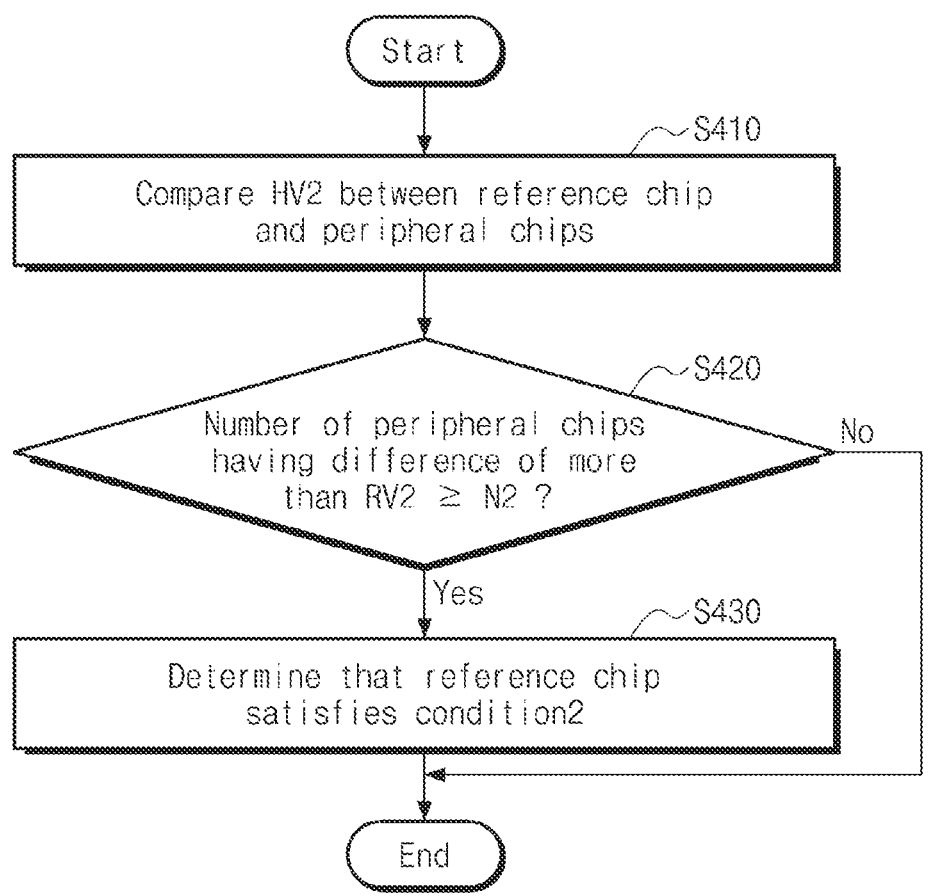

For example, the defect detector 122 may determine whether the reference chip satisfies a first condition 'Condition1' by comparing the result data 'RES_D' of the reference chip and peripheral chips based on the first information corresponding to the first height value 'HV1.' Additionally or alternatively, the defect detector 122 may determine whether the reference chip satisfies a second condition 'Condition2' by comparing the result data 'RES_D' of the reference chip and peripheral chips based on the second information corresponding to the second height value 'HV2.' In response to determining that the reference chip satisfies both the first condition 'Condition1' and the second condition 'Condition2', the defect detector 122 may select the coordinate of the reference chip as the first suspected coordinate 'S_COOR_1.' A detailed description with respect to the first condition 'Condition1' and the second condition 'Condition2' will be described later with reference to FIGS. 8A and 8B.

In an operation S240, the defect detector 122 may determine whether one or more second suspected coordinates 'S_COOR_2' exist around the first suspected coordinate 'S_COOR_1.'

For example, the defect detector 122 may determine whether at least one chip satisfying the first condition 'Condition1' exists among peripheral chips of the reference chip selected as the first suspected coordinate 'S_COOR_1.' In response to determining that at least one chip satisfying the first condition 'Condition1' exists, the defect detector 122 may select the coordinate(s) of the corresponding chip(s) as the second suspected coordinate(s) 'S_COOR_2' and may determine that the second suspected coordinate(s) 'S_COOR_2' exist.

Additionally or alternatively, the defect detector 122 may determine whether there is at least one chip satisfying the second condition 'Condition2' among peripheral chips of the reference chip selected as the first suspected coordinate 'S_COOR_1.' In response to determining that at least one chip satisfying the second condition 'Condition2' exists, the defect detector 122 may select the coordinate(s) of the corresponding chip(s) as the second suspected coordinate(s) 'S_COOR_2' and may determine that the second suspected coordinate(s) 'S_COOR_2' exist.

Additionally or alternatively, the defect detector 122 may determine whether there is at least one chip that satisfies both the first condition 'Condition1' and the second condition 'Condition2' among peripheral chips of the reference chip selected as the first suspected coordinate 'S_COOR_1.' In response to determining that there exists at least one chip that satisfies both the first condition 'Condition1' and the second condition 'Condition2,' the defect detector 122 may select the coordinate(s) of the corresponding chip(s) as the second suspected coordinate(s) 'S_COOR_2' and may determine that the suspected coordinate(s) 'S_COOR_2' exist.

In an operation S250, in response to determining that the second suspected coordinate(s) 'S_COOR_2' exist around the first suspected coordinate 'S_COOR_1,' the defective detector 122 may select the coordinate of the reference chip as the defect coordinate 'DF_COOR.'

Figure 7:
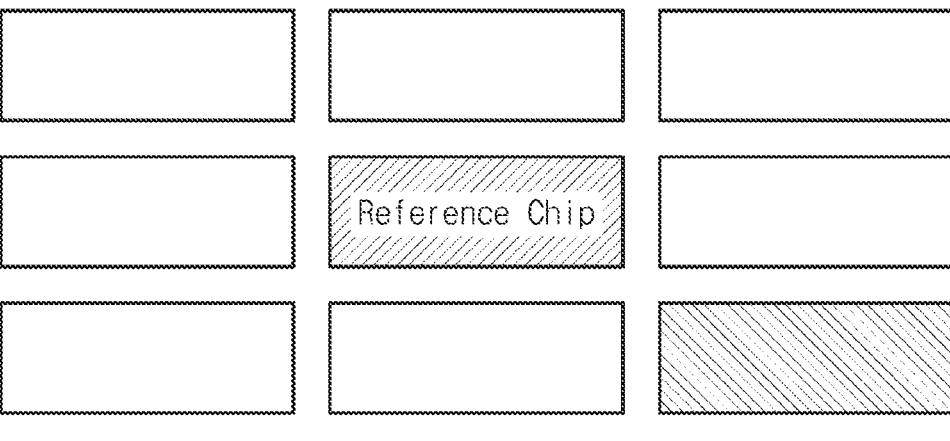
FIG. 7 is a conceptual diagram for describing a defect detection method of a defect detector according to an embodiment of the present disclosure.

FIG. 7 is a conceptual diagram illustrating a defect detection method of the defect detector 122 as an example according to an embodiment of the present disclosure. In some examples, the conceptual diagram illustrating a defect detection method of the defect detector 122 as described with reference to FIG. 7 may implement aspects of or may be implemented by aspects as described with reference to FIGS. 1-6. Referring to FIGS. 1, 3, 6, and 7, when the reference chip satisfies both the first condition 'Condition1' and the second condition 'Condition2,' the defect detector 122 may select the reference chip for the first suspected coordinate 'S_COOR_1.'

When the reference chip is selected as the first suspected coordinate 'S_COOR_1,' the defect detector 122 may determine whether the second suspected coordinate 'S_COOR_2' exists among peripheral chips surrounding the reference chip.

For example, when there is at least one chip that satisfies the first condition 'Condition1' among peripheral chips, the defect detector 122 may select the coordinate(s) of the corresponding chip(s) as the second suspected coordinate(s) 'S_COOR_2' and may determine that the second suspected coordinate(s) 'S_COOR_2' exist.

In response to determining that the second suspected coordinate(s) 'S_COOR_2' exist around the first suspected coordinate 'S_COOR_1,' the defective detector 122 may select the coordinate of the reference chip as the defect coordinate 'DF_COOR.'

FIG. 8A and FIG. 8B are flowcharts illustrating the operation S230 as described with reference to FIG. 6 in detail. Referring to FIGS. 1, 3, 6, and 8A, in an operation S310, the defect detector 122 may compare the first height values 'HV1' of the reference chip and peripheral chips. For example, the defect detector 122 may compare the first height value 'HV1' of the reference chip with the first height values 'HV1' of the peripheral chips.

In an operation S320, based on comparing the first height values 'HV1' of the reference chip and the peripheral chips, it may be determined whether the number of peripheral chips having a difference of more than a first reference value 'RV1' is greater than or equal to a first number 'N1.'

For example, based on comparing the first height value 'HV1' of the reference chip with the first height values 'HV1' of the peripheral chips, it may be determined that the number of peripheral chips having a difference of more than the first reference value 'RV1' is greater than or equal to the first number 'N1.' In some embodiments, the first reference value 'RV1' may be a value between 3.5 micrometers or microns (µm) and 5 µm, and the first number 'N1' may be any natural number.

In an operation S330, based on determining that the number of peripheral chips having the difference of more than the first reference value 'RV1' is greater than or equal to the first number 'N1,' the defect detector 122 may determine that the reference chip satisfies the first condition 'Condition1.'

Referring to FIGS. 1, 3, 6, and 8B, in an operation S410, the defect detector 122 may compare the second height values 'HV2' of the reference chip and peripheral chips. For example, the defect detector 122 may compare the second height value 'HV2' of the reference chip with the second height values 'HV2' of the peripheral chips.

In an operation S320, based on comparing the second height values 'HV2' of the reference chip and the peripheral chips, it may be determined whether the number of peripheral chips having a difference of more than a second reference value 'RV2' is greater than or equal to a second number 'N2.'

For example, based on comparing the second height value 'HV2' of the reference chip and the second height values 'HV2' of the peripheral chips, it may be determined whether the number of peripheral chips having a difference of more than the second reference value 'RV2' is greater than or equal to the second number 'N2.' In some embodiments, the second reference value 'RV2' may be a value between 3.5 µm and 5 µm, and the second number 'N2' may be any natural number.

In an operation S330, based on determining that the number of peripheral chips having a difference of more than the second reference value 'RV2' is greater than or equal to the second number 'N2,' the defect detector 122 may determine that the reference chip satisfies the second condition 'Condition2.'

Figures 9, 10:
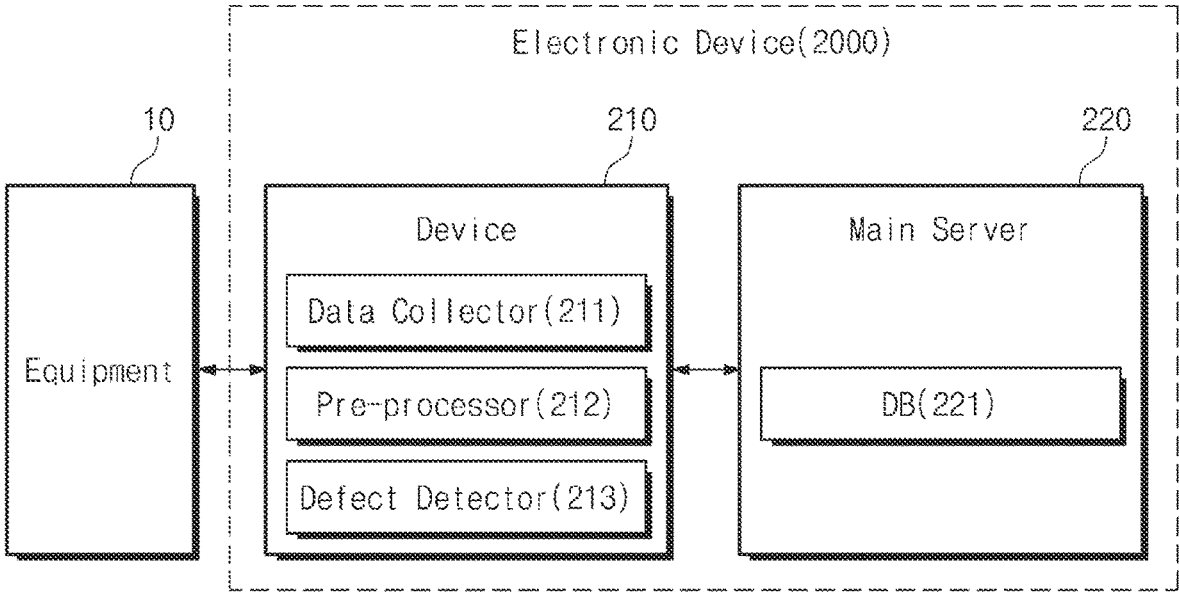
FIG. 9 is a diagram illustrating a defect detection result according to an embodiment of the present disclosure.
FIG. 10 is a block diagram illustrating an electronic device according to an embodiment of the present disclosure.

FIG. 9 is a diagram illustrating a defect detection result according to an embodiment of the present disclosure. In some examples, the diagram illustrating a defect detection result as described with reference to FIG. 9 may implement aspects of or may be implemented by aspects as described with reference to FIGS. 1-8B. In the example of FIG. 9, the first number 'N1' and the second number 'N2' (e.g., as described with reference to FIGS. 8A and 8B, respectively) may both be three (3). Additionally, FIG. 9 may illustrate the defect detection result when the first suspected coordinate 'S_COOR_1' is selected according to whether both the first condition 'Condition1' and the second condition 'Condition2' are satisfied, and the second suspected coordinate 'S_COOR_2' is selected according to whether the first condition 'Condition1' is satisfied.

Referring to FIGS. 1 and 9, when the first reference value 'RV1' is 5 µm and the second reference value 'RV2' is 5 µm, the accuracy of defect detection of the electronic device 1000 may be around 94%. When the first reference value 'RV1' is 5 µm and the second reference value 'RV2' is 3.5 µm, the accuracy of defect detection of the electronic device 1000 may be around 80%.

FIG. 10 is a block diagram illustrating an electronic device 2000 according to an embodiment of the present disclosure as an example. In some examples, the block diagram illustrating the electronic device 2000 as described with reference to FIG. 10 may be implemented by aspects of or may implement aspects as described with reference to FIGS. 1-9. For example, in the example of FIG. 10, a data collector 211 may perform similar or same operations as the data collector 111 as described with reference to FIG. 1, a pre-processor 212 may perform similar or same operations as the pre-processor 121 as described with reference to FIG. 1, a defect detector 213 may perform similar or same operations as the defect detector 122 as described with reference to FIG. 1, and a main server 220 may perform similar or same operations as the main server 130 as described with reference to FIG. 1. Therefore, additional descriptions will be omitted to avoid redundancy.

Referring to FIG. 10, the electronic device 2000 may include a device 210 and the main server 220. In some embodiments, the device 210 may be a computing system configured to process or store various information, such as PCs, notebook computers, laptop computers, servers, application servers, workstations, tablet PCs, smart phones, digital cameras, black-box devices, etc.

In some embodiments, the device 210 may communicate with the equipment 10. For example, the device 210 may communicate with the equipment 10 to obtain data. Additionally, in some embodiments, the device 210 may process the obtained data. Subsequently, the device 210 may transmit the obtained data and the processed data to the main server 220.

The device 210 may include the data collector 211, the pre-processor 212, and the defect detector 213. The data collector 211, the pre-processor 212, and the defect detector 213 may be implemented by hardware, software, or a combination of the hardware and the software.

In some embodiments, the data collector 211, the pre-processor 212, and the defect detector 213 may be implemented in software. At least some of the functions implemented in software may be stored as instructions in a non-transitory computer-readable medium (not illustrated). A processor of the first device 110 may cause the first device 110 to perform functions corresponding to the instructions by executing instructions stored in the non-transitory computer-readable medium.

In the above embodiments, components according to the present disclosure are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

According to an embodiment of the present disclosure, it is possible to improve product yield by detecting defects due to sticking particles in a stage of an equipment and removing the cause.

According to an embodiment of the present disclosure, it is possible to improve the equipment by tracking the cause of particle generation in the equipment.

According to an embodiment of the present disclosure, it is possible to eliminate the accompanying suicide phenomenon by removing defective chips during multi-stage stacking of chips.

According to an embodiment of the present disclosure, it is possible to detect defects due to particles in real time at the time of completion of the bonding process by utilizing the profile data of the equipment without an additional sensor.

The above descriptions are specific embodiments for carrying out the present disclosure. Embodiments in which a design is changed simply or which are easily changed may be included in the scope of the present disclosure as well as an embodiment described above. In addition, technologies that are easily changed and implemented by using the above-mentioned embodiments may be also included in the scope of the present disclosure.

What is claimed is:

1. A method of operating an electronic device, the method comprising:

obtaining, by the electronic device, profile data including operation information of an equipment during a bonding process, wherein the bonding process comprises forming a semiconductor chip based on bonding a plurality of chips on a substrate;

calculating, by the electronic device, characteristic data of bonded chips by pre-processing the profile data; and after the bonding process, selecting, by the electronic device, a defective chip of the plurality of chips based on comparing result data of a reference chip and peripheral chips based on the characteristic data, wherein the result data comprises respective height value information of the bonded chips.

2. The method of claim 1, wherein the characteristic data comprises first information and second information, wherein the first information corresponds to a first height value of a respective chip at a moment when a header of the equipment and the respective chip are first touched, and wherein the second information corresponds to a second height value when the respective chip is pressed to a first pressure value.

3. The method of claim 2, wherein the characteristic data comprises third information corresponding to a third height value of the respective chip pressed to a second pressure value greater than the first pressure value, and wherein the second information is calculated based on the first information and the third information.

4. The method of claim 3, wherein the selecting of the defective chip comprises:

selecting at least one of the result data of the bonded chips as representative data based on the third information; and correcting deviations between the result data of the bonded chips based on the representative data.

5. The method of claim 4, wherein the representative data comprises result data of a chip having a lowest third height value.

6. The method of claim 4, wherein the selecting of the at least one of the result data of the bonded chips as representative data based on the third information comprises:

dividing the substrate into a first area and a second area;

selecting first representative data with respect to the first area; and selecting second representative data with respect to the second area, wherein the correcting of the deviations between the result data of the bonded chips based on the representative data comprises:

correcting the deviations between result data of chips bonded in the first area based on the first representative data; and correcting the deviations between result data of chips bonded in the second area based on the second representative data.

7. The method of claim 4, wherein the selecting of the defective chip comprises:

selecting a coordinate of the reference chip as a first suspected coordinate of the defective chip;

determining whether a second suspected coordinate exists around the first suspected coordinate; and selecting the coordinate of the reference chip as a defect coordinate corresponding to the defective chip based on determining that the second suspected coordinate exists around the first suspected coordinate.

8. The method of claim 7, wherein the selecting of the coordinate of the reference chip as the first suspected coordinate at which the defect can occur comprises:

determining whether the reference chip satisfies a first condition by comparing the result data of the reference chip and the peripheral chips based on the first information;

determining whether the reference chip satisfies a second condition by comparing the result data of the reference chip and the peripheral chips based on the second information; and selecting the coordinate of the reference chip as the first suspected coordinate based on determining that the reference chip satisfies both the first condition and the second condition.

9. The method of claim 8, wherein the determining of whether the reference chip satisfies the first condition comprises:

comparing a first height value of the reference chip with first height values of the peripheral chips;

based on comparing the first height value of the reference chip with the first height values of the peripheral chips, determining whether a number of the peripheral chips having a difference of more than a first reference value is greater than or equal to a first number; and determining that the reference chip satisfies the first condition based on determining that the number of the peripheral chips is greater than or equal to the first number.

10. The method of claim 9, wherein the determining of whether the reference chip satisfies the second condition comprises:

comparing a second height value of the reference chip with second height values of the peripheral chips;

based on comparing the second height value of the reference chip with the second height values of the peripheral chips, determining whether a number of the peripheral chips having a difference of more than a second reference value is greater than or equal to a second number; and determining that the reference chip satisfies the second condition based on determining that the number of the peripheral chips is greater than or equal to the second number.

11. The method of claim 10, wherein the determining of whether the second suspected coordinate exists around the first suspected coordinate comprises:

selecting a coordinate of a chip that satisfies the first condition as the second suspected coordinate.

12. The method of claim 1, wherein the profile data comprises coordinate information at which the equipment performs the bonding process, pressure information applied to the chip by the equipment, or a combination thereof.

13. The method of claim 1, wherein the obtaining of the profile data comprises:

linking information associated with the substrate to the obtained profile data.

14. An electronic device comprising:

a first device connected to an equipment, the first device comprising a data collector configured to acquire profile data including operation information of the equipment from the equipment performing a bonding process of a semiconductor chip;

a second device comprising a pre-processor and a defect detector, wherein the pre-processor is configured to pre-process the profile data to calculate characteristic data of bonded chips and wherein the defect detector is configured to select a defect coordinate of a defective chip on a substrate by comparing result data of a reference chip and peripheral chips based on the characteristic data after the bonding process is completed; and a main server configured to store data generated during the bonding process, wherein the result data comprises respective height value information of the bonded chips.

15. The electronic device of claim 14, wherein the characteristic data comprises first information and second information, wherein the first information corresponds to a first height value of a respective chip at a moment when a header of the equipment and the respective chip are first touched, and wherein the second information corresponds to a second height value when the respective chip is pressed to a first pressure value.

16. The electronic device of claim 15, wherein the characteristic data comprises third information corresponding to a third height value of the respective chip pressed to a second pressure value greater than the first pressure value, and wherein the second information is calculated based on the first information and the third information.

17. The electronic device of claim 16, wherein the defect detector is configured to:

select at least one of the result data of the bonded chips as representative data based on the third information; and correct deviations between the result data of the bonded chips based on the representative data.

18. The electronic device of claim 17, wherein the defect detector is configured to:

select a coordinate of the reference chip as a first suspected coordinate of the defective chip:

determine whether a second suspected coordinate exists around the first suspected coordinate; and select the coordinate of the reference chip as the defect coordinate based on determining that the second suspected coordinate exists around the first suspected coordinate.

19. The electronic device of claim 18, wherein the defect detector is configured to:

determine whether the reference chip satisfies a first condition by comparing the result data of the reference chip and the peripheral chips based on the first information;

determine whether the reference chip satisfies a second condition by comparing the result data of the reference chip and the peripheral chips based on the second information; and select the coordinate of the reference chip as the first suspected coordinate based on determining that the reference chip satisfies both the first condition and the second condition.

20. A server comprising:

a memory configured to store instructions; and a processor configured to access the memory and to execute the instructions loaded into the memory, wherein the instructions, when executed by the processor, cause the processor to:

obtain profile data including operation information of an equipment performing a bonding process of a chip from an outside device;

calculate characteristic data of bonded chips by pre-processing the profile data; and after the bonding process is completed, select a coordinate of a defective chip on a substrate as a defect coordinate based on comparing result data of a reference chip and peripheral chips based on the characteristic data, wherein the result data comprises respective height value information of the bonded chips, and wherein each of the characteristic data comprises first information and second information, wherein the first information corresponds to a first height value of a respective chip at a moment when a header of the equipment and the respective chip are first touched, and wherein the second information corresponds to a second height value when the respective chip is pressed.

* * * * *